United States Patent [19]

Moore et al.

[11] 4,322,679
[45] Mar. 30, 1982

[54] ALTERNATING CURRENT COMPARATOR BRIDGE FOR RESISTANCE MEASUREMENT

[75] Inventors: William J. M. Moore; Norbert L. Kusters, both of Ottawa, Canada

[73] Assignee: Canadian Patents & Dev. Limited, Ottawa, Canada

[21] Appl. No.: 137,899

[22] Filed: Apr. 7, 1980

[51] Int. Cl.³ .................................................. G01R 27/02
[52] U.S. Cl. .................................. 324/62; 324/DIG. 1
[58] Field of Search ............................ 324/62, DIG. 1

[56] References Cited

U.S. PATENT DOCUMENTS

| | | | |
|---|---|---|---|
| 1,856,202 | 5/1932 | Wilson | 324/62 |
| 3,142,015 | 7/1964 | Kusters et al. | 324/DIG. 1 |
| 3,188,562 | 6/1965 | Kusters et al. | 324/55 |
| 3,523,247 | 8/1970 | Clifford et al. | 324/62 |
| 3,849,727 | 11/1974 | Kusters et al. | 324/74 X |
| 4,238,726 | 12/1980 | Ichijo | 324/62 X |

Primary Examiner—Stanley T. Krawczewicz
Attorney, Agent, or Firm—Edward Rymek

[57] ABSTRACT

The ac current comparator bridge measures the resistance of an unknown resistor at 50–60 Hz with an accuracy in the order of 10 parts per million. The current in the unknown resistor is compared, using a current comparator, to the current in a reference resistor for the in-phase component, and to the current in a reference capacitor for the quadrature component or phase defect. Once an ampere-turn balance is achieved in the comparator by adjusting the winding turns, the unknown resistor's values are a function of the reference resistor, the reference capacitor, the voltage sources driving the currents through the unknown resistor and the references, as well as the turns of the windings.

4 Claims, 1 Drawing Figure

ALTERNATING CURRENT COMPARATOR BRIDGE FOR RESISTANCE MEASUREMENT

BACKGROUND OF THE INVENTION

This invention is directed to the measurement of resistors and in particular to the measurement of resistors under ac conditions.

The measurement of resistors in the range from less than 1 Ω to over 1 MΩ at direct currents with better than one ppm accuracy has been carried out using a dc comparator bridge as described in the publication entitled, "A Direct Current Comparator Bridge for High Resistance Measurements", by N. L. Kusters and M. P. MacMartin, IEEE Trans. on Instrumentation and Measurements, Vol. IM-22, No. 4, pp 382–386, December 1973.

However, power resistors which have the same dc resistance do not always have the same reactive component and therefore do not act in the same manner under ac conditions. It is preferred for many applications to be able to measure both the resistive and the reactive components of resistances under ac conditions. Until the present invention, an ac comparator bridge had not been developed though a "Current Comparator for Power and Energy Measurements" is described in U.S. Pat. No. 3,849,727 which issued on Nov. 19, 1974 to N. L. Kusters et al.

SUMMARY OF THE INVENTION

It is therefore an object of this invention to provide a comparator bridge for measuring resistance under ac conditions.

In accordance with one aspect of the invention, the ac comparator bridge for measuring an unknown resistor includes a current comparator which has first primary winding, and first and second secondary windings, each having a variable number of turns. The bridge also includes an ac voltage source, a standard resistor connected between the voltage source and the first secondary winding, and a standard reactive element connected between the voltage source and the second secondary winding. The unknown resistor is connected between terminals, one of which is coupled to the voltage source and the other to the primary winding. A detector determines ampere-turn balance between the primary winding and the secondary windings such that the value of the unknown resistor is a function of the values of the voltage source, the standard resistor, the reactive element and the number of turns in the primary and secondary windings.

In accordance with another aspect of the invention, the reactive element is preferably a standard high quality capacitor. In addition, the voltage source consists of two voltage sources having the same waveform, but different amplitudes. The first voltage source, of higher or lower amplitude, is connected to the unkown resistor while the second voltage source is connected to the resistor and the capacitor. The detector includes a detector winding magnetically coupled to the primary and secondary windings, an amplifier for amplifying the signal on the detector winding, and a meter connected to the amplifier to provide a reading of the amplified signal. The amplifier has preferably a variable gain such that small differences in the ampere-turn balance may be detected.

Many other objects and aspects of the invention will be clear from the detailed description of the drawings.

DETAILED DESCRIPTION OF THE EMBODIMENTS

Figure 1:
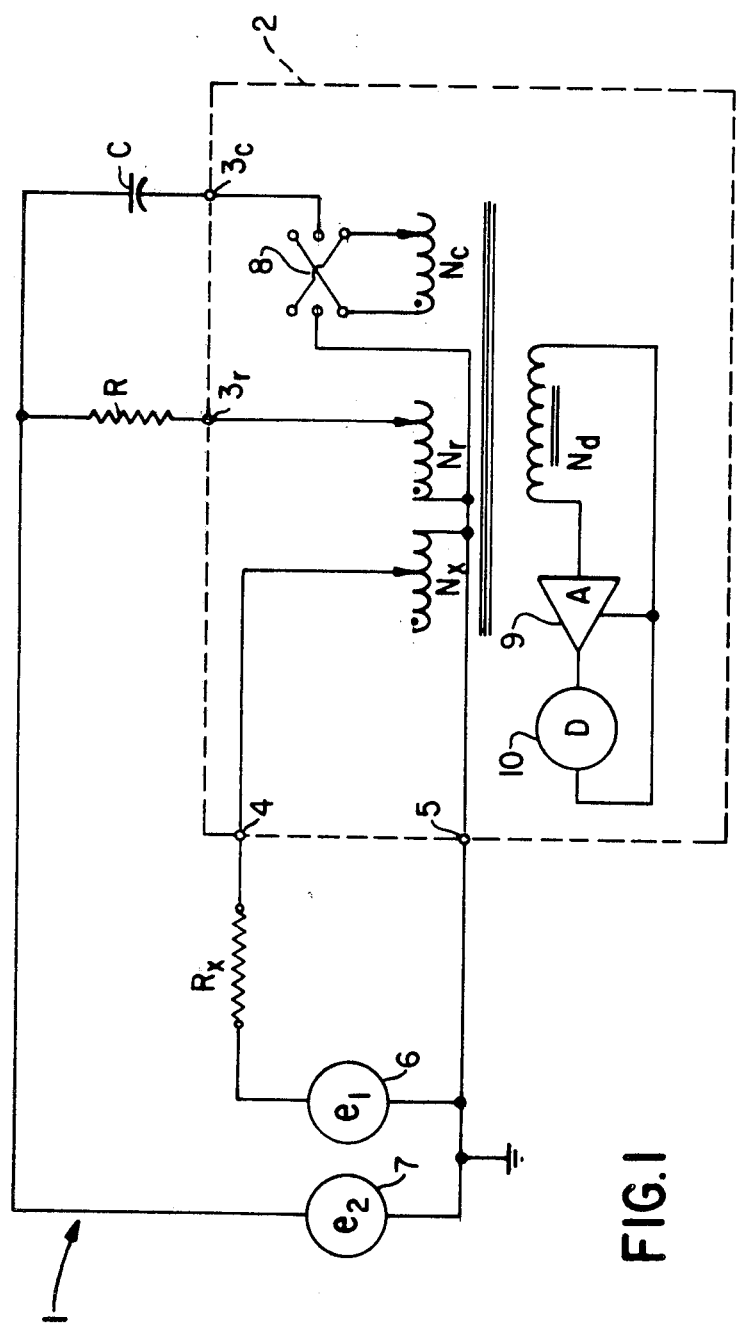
FIG. 1 illustrates the ac comparator bridge in accordance with the present invention.

The ac comparator bridge 1 in accordance with the present invention is illustrated in FIG. 1. The bridge includes a current comparator 2 with input terminals $3_c$, $3_r$ and 4 and a ground terminal 5, a first voltage source 6, a second voltage source 7, a resistor R connected between the second voltage source 7 and terminal $3_r$, and a standard capacitor C connected between the second voltage source 7 and terminal $3_c$. The current comparator 2 may be of the type described in U.S. Pat. No. 3,188,562 which issued on June 8, 1965 to N. L. Kusters et al.

The current comparator 2 includes a variable primary winding $N_x$, variable secondary windings $N_r$ and $N_c$ and a detector winding $N_d$. The primary winding $N_x$ is connected between terminal 4 and ground terminal 5. Winding $N_r$ is connected between terminal $3_r$ and ground terminal 5. Winding $N_c$ is connected between terminal $3_c$ and ground terminal 5 through a double-pole, double-throw switch 8. The switch 8 is used to provide either a lag or a lead balancing current as required. The detector winding $N_d$ is connected through a variable gain amplifier 9 to a null detector 10.

The unknown resistor $R_x$ is connected between the voltage source 6 and terminal 4. Winding $N_x$ may have a fixed number of turns, though the instrument would have a greater range if the number of turns could be varied. A current $i_x$, the magnitude and phase of which is directly dependent on resistor $R_x$, is caused to flow through winding $N_x$.

An in-phase balancing current $i_r$ is caused to flow through secondary winding $N_r$ since the voltage source 7 is connected to resistor R, and a quadrature current $i_c$ is caused to flow through secondary winding $N_c$ since the voltage source 7 is connected to capacitor C.

Null detector 10 detects when an ampere-turn balance occurs of the current in $N_x$ and the currents in $N_r$ and $N_c$. The number of turns in winding $N_r$ is adjusted until a minimum is detected on detector 10, then the number of turns in winding $N_c$ is adjusted until a further minimum is detected. This procedure may be repeated until a null is achieved on detector 10 indicating a balance between the ampere-turns $i_x N_x$ of the in-phase and quadrature components in winding $N_x$ and the ampere-turns $i_r N_r$ and $i_c N_c$ of the respective currents in windings $N_r$ and $N_c$. It is also preferable that amplifier 9 be adjustable to allow for greater sensitivity as balance is being achieved.

The turns adjustments of $N_x$, $N_r$ and $N_c$ may be done manually or automatically under the control of the output signal from amplifier 9.

At balance, the value of $R_x$ can be determined from the equation:

$$\frac{1}{R_x} = \frac{e_2}{e_1}\left(\frac{1}{N_x}\right)\left(\frac{N_r}{R} \pm jwCN_c\right) \quad (1)$$

or

-continued
$$R_x = \frac{e_1}{e_2} \times \frac{N_x}{\frac{N_r}{R} \pm jwCN_c}$$

If the voltages of sources 6 and 7 are equal, then ($e_1/e_2 = 1$) and would disappear from equation (1); however it is preferred to have two different voltage magnitudes $e_2$ and $e_1$. Voltage $e_2$ would normally be smaller than $e_1$, since resistor R and capacitor C must be of high quality and stability and therefore will pass only small currents. On the other hand, the unknown resistor $R_x$ could be a power resistor which would be used at normal power levels. However, if two sources 6 and 7 are used, they must be at the same frequency and have the same waveform.

Since $i_x$ would normally be quite large relative to $i_r$ and $i_c$, the number of turns in winding $N_x$ would normally be small relative to the number of turns in windings $N_r$ and $N_c$.

Many modifications in the above described embodiments of the invention can be carried out without departing from the scope thereof and therefore the scope of the present invention is intended to be limited only by the appended claims.

We claim:

1. An ac comparator bridge for measuring an unknown resistor comprising:
   current comparator means having first primary winding means $N_x$, first secondary winding means $N_r$ having a variable number of turns, and a second secondary winding means $N_c$ having a variable number of turns;
   ac voltage source means;
   standard resistor means connected between the voltage source means and the first secondary winding means $N_r$;
   standard reactive means connected between the voltage source means and the second secondary winding means $N_c$;
   terminal means between the voltage source means the the primary winding means $N_x$ for connection to the unknown resistor; and
   detector means for determining ampere-turn balance between the primary and the secondary winding means whereby the value of the unknown resistor is a function of the voltage source means voltage, the resistive means, the reactive means and the number of turns in the primary and secondary winding means.

2. An ac comparator bridge as claimed in claim 1 wherein the reactive means is a capacitor means.

3. An ac comparator bridge as claimed in claim 2 wherein the voltage source means includes two voltage sources having the same frequency and waveform, the first voltage source being connected to the unknown resistor terminal means, the second voltage source having a voltage lower in magnitude than the first voltage source and being connected to the resistor means and the capacitor means.

4. An ac comparator as claimed in claims 1, 2 or 3 wherein the detector means includes a detector winding means magnetically coupled to the primary and secondary winding means, amplifier means for amplifying the signal on the detector winding means and meter means connected to the amplifier means for providing a reading of the amplified signal.

* * * * *